(12) United States Patent
Li

(10) Patent No.: US 12,048,107 B2
(45) Date of Patent: Jul. 23, 2024

(54) FOLDING DISPLAY DEVICE AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Jiang Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 290 days.

(21) Appl. No.: 17/623,962

(22) PCT Filed: Dec. 17, 2021

(86) PCT No.: PCT/CN2021/139226
§ 371 (c)(1),
(2) Date: Dec. 30, 2021

(87) PCT Pub. No.: WO2023/103045
PCT Pub. Date: Jun. 15, 2023

(65) Prior Publication Data
US 2023/0180407 A1 Jun. 8, 2023

(30) Foreign Application Priority Data
Dec. 7, 2021 (CN) .......................... 20111482140.3

(51) Int. Cl.
*H05K 5/02* (2006.01)
*H05K 5/00* (2006.01)

(52) U.S. Cl.
CPC ......... *H05K 5/0221* (2013.01); *H05K 5/0018* (2022.08); *H05K 5/0226* (2013.01)

(58) Field of Classification Search
CPC .. H05K 5/0221; H05K 5/0018; H05K 5/0226; G06F 1/1679; G06F 1/1681;
(Continued)

(56) References Cited

U.S. PATENT DOCUMENTS 11,336,759 B2 * 5/2022 Liao ...................... H04M 1/021
11,693,455 B2 * 7/2023 Lee ........................ G06F 1/1641
16/331
(Continued)

FOREIGN PATENT DOCUMENTS

CN 206470751 U 9/2017
CN 110312029 A 10/2019
(Continued)

*Primary Examiner* — Anthony Q Edwards
*Assistant Examiner* — Hung Q Dang
(74) *Attorney, Agent, or Firm* — Rivka Friedman

(57) ABSTRACT

A folding display device and electronic device are provided. The folding display device includes a first middle frame, a second middle frame, two bending members, a flexible display panel, and a first deadlocking structure. The first deadlocking structure includes a first deadlocking component fixedly connected to the first middle frame and a second deadlocking component fixedly connected to the second middle frame. When the folding display device receives a first force, the two deadlocking components are locked and connected to reduce probability of defects in the bending members. When the folding display device receives a second, the two deadlocking components are unlocked to realize free folding.

20 Claims, 4 Drawing Sheets

(58) Field of Classification Search
CPC ... G06F 1/1652; H04M 1/0268; H04M 1/185; H04M 1/0216; G09F 9/301
See application file for complete search history.

(56) References Cited

U.S. PATENT DOCUMENTS

| | | | |
|---|---|---|---|
| 2019/0166703 | A1 | 5/2019 | Kim et al. |
| 2021/0068276 | A1 | 3/2021 | Kim et al. |
| 2023/0035597 | A1* | 2/2023 | Liu .................... F16C 11/04 |

FOREIGN PATENT DOCUMENTS

| | | |
|---|---|---|
| CN | 210518451 U | 5/2020 |
| CN | 111766970 A | 10/2020 |
| CN | 112392852 A | 2/2021 |
| CN | 113366406 A | 9/2021 |
| CN | 113611226 A | 11/2021 |
| CN | 113707015 A | 11/2021 |
| JP | 2009114816 A | 5/2009 |
| JP | 2009138790 A | 6/2009 |
| WO | 2021197172 A1 | 10/2021 |

* cited by examiner

FOLDING DISPLAY DEVICE AND ELECTRONIC DEVICE

TECHNICAL FIELD

The present disclosure relates to the display technology field, and more particularly to a folding display device and an electronic device.

BACKGROUND ART

Currently, two middle frames of a folding display device are usually connected by a rotating shaft. When the folding display device falls, impact force directly acts on the rotating shaft. This easily causes a technical problem that the rotating shaft is defective, and bending effect and display effect are affected.

Technical Problem

Embodiments of the present disclosure provide a folding display device and an electronic device to solve the technical problem that a rotating shaft is easily defective when a conventional folding display device falls and impact force directly acts on the rotating shaft.

Technical Solution

To solve the above-mentioned problem, technical schemes provided by the present disclosure are described as follows.

The present disclosure provides a folding display device including:

a first middle frame;

a second middle frame;

two bending members, wherein the first middle frame and the second middle frame are rotatably connected by the bending members, each of the bending members includes a rotating shaft and two supporting plates, the rotating shaft is fixedly connected to the two supporting plates, and the two supporting plates are fixedly connected to the first middle frame and the second middle frame respectively at one side away from the rotating shaft;

a flexible display panel laid at one side of each of the first middle frame, the second middle frame, and the bending members; and a first deadlocking structure disposed at one side of one of the bending members, wherein the first deadlocking structure includes a first deadlocking component and a second deadlocking component, the first deadlocking component is fixedly connected to the first middle frame, and the second deadlocking component is fixedly connected to the second middle frame;

wherein when the folding display device receives a first force in a first direction, the first deadlocking component and the second deadlocking component are locked and connected; when the folding display device receives a second force in a second direction, the first deadlocking component and the second deadlocking component are unlocked; and the first direction and the second direction are perpendicular with each other.

According to the folding display device provided by the present disclosure, the first deadlocking component includes:

a first housing fixedly connected to the first middle frame, wherein a first accommodating cavity is provided in the first housing;

a first elastic member disposed in the first accommodating cavity and fixedly connected to the first housing, wherein a deformation direction of the first elastic member is along the first direction; and a first sliding block disposed in the first accommodating cavity and fixedly connected to the first elastic member; and the second deadlocking component includes:

a second housing fixedly connected to the second middle frame, wherein a second accommodating cavity is provided in the second housing;

a second elastic member disposed in the second accommodating cavity and fixedly connected to the second housing, wherein a deformation direction of the second elastic member is along the second direction; and a second sliding block disposed in the second receiving cavity and fixedly connected to the second elastic member; and wherein when the folding display device receives the first force, the first sliding block and the second sliding block cooperate with each other.

According to the folding display device provided by the present disclosure, an end of the first sliding block away from the first elastic member is provided with a limiting hole; when the folding display device receives the first force, the first sliding block and the limiting hole cooperate; and when the folding display device receives the second force, the second sliding block slides out from the limiting hole.

According to the folding display device provided by the present disclosure, the second deadlocking component further includes:

a third elastic member disposed at one side of the second housing away from the first housing and fixedly connected to the second housing, wherein a deformation direction of the third elastic member is along the first direction; and a stopper disposed in the second housing and fixedly connected to the third elastic member; and wherein when the folding display device receives the first force, the first sliding block pushes the stopper to slide out from the second housing; and when the folding display device receives the second force, the second sliding block blocks the first sliding block to slide.

According to the folding display device provided by the present disclosure, the stopper includes:

a bottom plate fixedly connected to the third elastic member;

a first limiting plate and a second limiting plate which are connected to the bottom plate, wherein the first limiting plate is configured to limit the first sliding block to slide along the first direction, and the second limiting plate is configured to limit the second sliding block to slide along the second direction.

According to the folding display device provided by the present disclosure, shapes of the first limiting plate and the second limiting plate are rectangular.

According to the folding display device provided by the present disclosure, the first middle frame is provided with a first connection groove, the second middle frame is provided with a second connection groove, the first housing is cooperatively connected to the first connection groove, and the second housing is cooperatively connected to the second connection groove.

According to the folding display device provided by the present disclosure, cross-sectional shapes of the first sliding block and the second sliding block are square.

According to the folding display device provided by the present disclosure, each of the first elastic member and the second elastic member includes a spring.

According to the folding display device provided by the present disclosure, the folding display device further includes a second deadlocking structure, the second deadlocking structure includes a third deadlocking component and a fourth deadlocking component, the fourth deadlocking component is fixedly connected to the first middle frame, and the third deadlocking component is fixedly connected to the second middle frame; and when the folding display device receives a third force along a third direction, the first deadlocking component and the fourth deadlocking component 52 are locked and connected; when the folding display device receives a fourth force along a fourth direction, the third deadlocking component and the fourth deadlocking component are unlocked; and the third direction is a direction opposite to the first direction, and the fourth direction is a direction opposite to the second direction.

The present disclosure provides a folding display device including:

a first middle frame;

a second middle frame;

two bending members, wherein the first middle frame and the second middle frame are rotatably connected by the bending members;

a flexible display panel laid at one side of each of the first middle frame, the second middle frame, and the bending members; and a first deadlocking structure disposed at one side of one of the bending members, wherein the first deadlocking structure includes a first deadlocking component and a second deadlocking component, the first deadlocking component is fixedly connected to the first middle frame, and the second deadlocking component is fixedly connected to the second middle frame;

wherein when the folding display device receives a first force in a first direction, the first deadlocking component and the second deadlocking component are locked and connected; when the folding display device receives a second force in a second direction, the first deadlocking component and the second deadlocking component are unlocked; and The first direction and the second direction are different.

According to the folding display device provided by the present disclosure, the first deadlocking component includes:

a first housing fixedly connected to the first middle frame, wherein a first accommodating cavity is provided in the first housing;

a first elastic member disposed in the first accommodating cavity and fixedly connected to the first housing, wherein a deformation direction of the first elastic member is along the first direction; and a first sliding block disposed in the first accommodating cavity and fixedly connected to the first elastic member; and the second deadlocking component includes:

a second housing fixedly connected to the second middle frame, wherein a second accommodating cavity is provided in the second housing;

a second elastic member disposed in the second accommodating cavity and fixedly connected to the second housing, wherein a deformation direction of the second elastic member is along the second direction; and a second sliding block disposed in the second receiving cavity and fixedly connected to the second elastic member; and wherein when the folding display device receives the first force, the first sliding block and the second sliding block cooperate with each other.

According to the folding display device provided by the present disclosure, an end of the first sliding block away from the first elastic member is provided with a limiting hole; when the folding display device receives the first force, the first sliding block and the limiting hole cooperate; and when the folding display device receives the second force, the second sliding block slides out from the limiting hole.

According to the folding display device provided by the present disclosure, the second deadlocking component further includes:

a third elastic member disposed at one side of the second housing away from the first housing and fixedly connected to the second housing, wherein a deformation direction of the third elastic member is along the first direction; and a stopper disposed in the second housing and fixedly connected to the third elastic member; and wherein when the folding display device receives the first force, the first sliding block pushes the stopper to slide out from the second housing; and when the folding display device receives the second force, the second sliding block blocks the first sliding block to slide.

According to the folding display device provided by the present disclosure, the stopper includes:

a bottom plate fixedly connected to the third elastic member;

a first limiting plate and a second limiting plate which are connected to the bottom plate, wherein the first limiting plate is configured to limit the first sliding block to slide along the first direction, and the second limiting plate is configured to limit the second sliding block to slide along the second direction.

According to the folding display device provided by the present disclosure, the first middle frame is provided with a first connection groove, the second middle frame is provided with a second connection groove, the first housing is cooperatively connected to the first connection groove, and the second housing is cooperatively connected to the second connection groove.

According to the folding display device provided by the present disclosure, each of the bending members includes a rotating shaft and two supporting plates, the rotating shaft is fixedly connected to the two supporting plates, and the two supporting plates are fixedly connected to the first middle frame and the second middle frame respectively at one side away from the rotating shaft.

According to the folding display device provided by the present disclosure, the folding display device further includes a second deadlocking structure, the second deadlocking structure includes a third deadlocking component and a fourth deadlocking component, the fourth deadlocking component is fixedly connected to the first middle frame, and the third deadlocking component is fixedly connected to the second middle frame; and when the folding display device receives a third force along a third direction, the first deadlocking component and the fourth deadlocking component 52 are locked and connected; when the folding display device receives a fourth force along a fourth direction, the third deadlocking component and the fourth deadlocking component are unlocked; and the third direction is a direction opposite to the first direction, and the fourth direction is a direction opposite to the second direction.

According to the folding display device provided by the present disclosure, the first direction and the second direction are perpendicular with each other.

The present disclosure provides an electronic device including a folding display device. The folding display device includes:

a first middle frame;

a second middle frame;

two bending members, wherein the first middle frame and the second middle frame are rotatably connected by the bending members;

a flexible display panel laid at one side of each of the first middle frame, the second middle frame, and the bending members; and a first deadlocking structure disposed at one side of one of the bending members, wherein the first deadlocking structure includes a first deadlocking component and a second deadlocking component, the first deadlocking component is fixedly connected to the first middle frame, and the second deadlocking component is fixedly connected to the second middle frame;

wherein when the folding display device receives a first force in a first direction, the first deadlocking component and the second deadlocking component are locked and connected; when the folding display device receives a second force in a second direction, the first deadlocking component and the second deadlocking component are unlocked; and The first direction and the second direction are different.

Advantageous Effects

The advantageous effects of the present disclosure are described as follows. The folding display device and electronic device provided by the embodiments of the present disclosure are provided with the first deadlocking structure at one side of the bending member. The first deadlocking structure includes the first deadlocking component and the second deadlocking component. The first deadlocking component is fixedly connected to the first middle frame, and the second deadlocking component is fixedly connected to the second middle frame. When the folding display device receives the first force along the first direction (when the folding display device falls), the first deadlocking component and the second deadlocking component are locked and connected to avoid the impact force acting on the bending member. This is beneficial for reducing the probability of defects in the bending members. When the folding display device receives the second force in the second direction (when the folding display device is folded), the first deadlocking component and the second deadlocking component are unlocked, so that the first middle frame 1 and the second middle frame are released from the fixed connection, thereby realizing free folding of the folding display device.

BRIEF DESCRIPTION OF DRAWINGS

To describe the technical solutions of the embodiments of the present disclosure more clearly, the following briefly introduces the accompanying drawings required for describing the embodiments. Apparently, the accompanying drawings in the following description show only some embodiments of the present disclosure, and those skilled in the art may still derive other drawings from these accompanying drawings without creative efforts.

Figure 1:
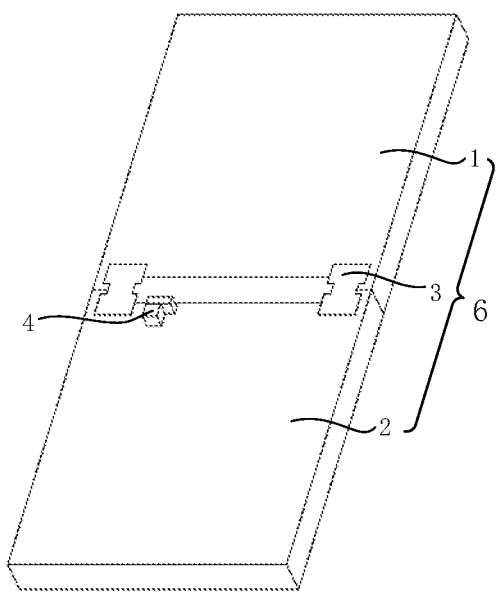
FIG. 1 illustrates a schematic plan view of a folding display device provided by an embodiment of the present disclosure.

Numerals in the drawings are described as follows:

first middle frame 1; second middle frame 2; bending member 3; rotating shaft 31; supporting plate 32; first deadlocking structure 4; first deadlocking component 41; first housing 411; first elastic member 412; first sliding block 413; limiting hole 4131; second deadlocking component 42; second housing 421; second elastic member; second sliding block 423; third elastic member 424; stopper 425; bottom plate 4251; first limiting plate 4252; second limiting plate 4253; second deadlocking structure 5; third deadlocking component 51; fourth deadlocking component 52.

DETAILED DESCRIPTION OF EMBODIMENTS

The following clearly describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure. Furthermore, it should be understood that specific implementations described herein are only used to illustrate and explain the present disclosure, and are not used to limit the present disclosure. In the present disclosure, if no explanation is made to the contrary, used orientation words, such as "upper" and "lower", generally refer to upper and lower directions of a device in an actual use or a working state, and specifically refer to drawing directions in the drawings. Words "inner" and "outer" refer to an outline of a device.

Figure 2:
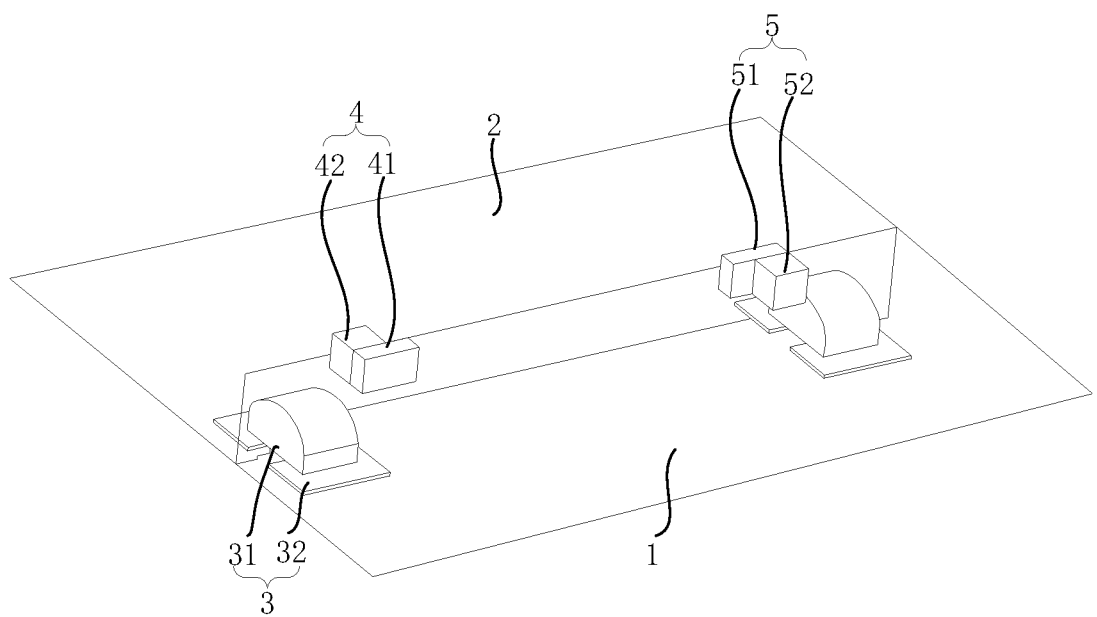
FIG. 2 illustrates a partial enlarged schematic view of FIG. 1.

Please refer to FIG. 1 and FIG. 2. FIG. 1 illustrates a schematic plan view of a folding display device provided by an embodiment of the present disclosure. FIG. 2 illustrates a partial enlarged schematic view of FIG. 1. An embodiment of the present disclosure provides a folding display device including a first middle frame 1, a second middle frame 2, two bending members 3, a flexible display panel 6, and a first deadlocking structure 4.

The first middle frame 1 and the second middle frame 2 are rotatably connected by the bending members 3. The flexible display panel 6 is laid at one side of each of the first middle frame 1, the second middle frame 2, and the bending members 3. The flexible display panel 6 can be an organic light emitting diode display panel.

The first deadlocking structure 4 is disposed at one side of one of the bending members 3. The first deadlocking structure 4 includes a first deadlocking component 41 and a second deadlocking component 42. The first deadlocking component 41 is fixedly connected to the first middle frame 1, and the second deadlocking component 42 is fixedly connected to the second middle frame 2.

It can be understood that when the folding display device falls, that is, when the folding display device receives a first force in a first direction, the first deadlocking component 41 and the second deadlocking component 42 are locked and connected, so that the first middle frame 1 and the second middle frame 2 are fixedly connected to avoid impact force acting on the bending members 3. This is beneficial for reducing probability of defects in the bending members 3. When the folding display device is folded, that is, when the folding display device receives a second force in a second direction, the first deadlocking component 41 and the second deadlocking component 42 are unlocked, so that the first middle frame 1 and the second middle frame 2 are released from a fixed connection state, thereby realizing free folding of the folding display device.

The first direction and the second direction are different. Optionally, the first direction and the second direction are perpendicular with each other. The first direction is an x direction, and the second direction is a y direction.

Specifically, each of the bending members 3 includes a rotating shaft 31 and two supporting plates 32. The rotating shaft 31 is fixedly connected to the two supporting plates 32. The two supporting plates 32 are fixedly connected to the first middle frame 1 and the second middle frame 2 respectively at one side away from the rotating shaft 31.

In the embodiment of the present disclosure, the folding display device includes two bending members 3. The two bending members 3 are respectively disposed on ends of the first middle frame 1 and the second middle frame 2. The directions of the first force received by the two bending members 3 are opposite, and the directions of the second forces received by the two bending members 3 are opposite.

Figure 3:
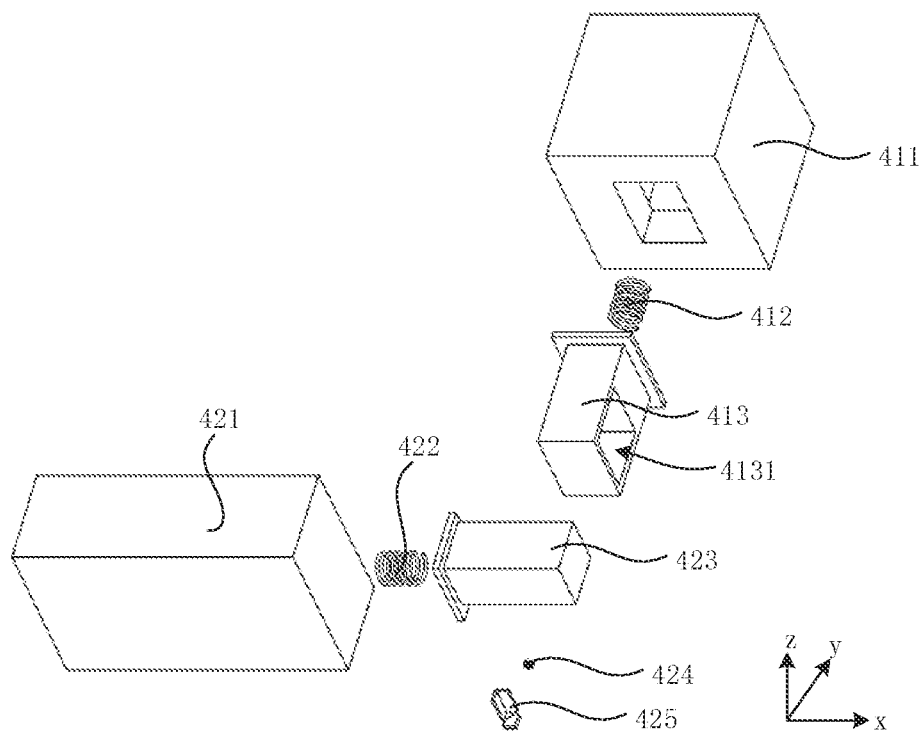
FIG. 3 illustrates a schematic structure diagram of the first deadlocking structure provided by an embodiment of the present disclosure.

Specifically, please refer to FIG. 3. FIG. 3 illustrates a schematic structure diagram of the first deadlocking structure provided by an embodiment of the present disclosure. The first deadlocking component 41 includes a first housing 411, a first elastic member 412, and a first sliding block 413. The first housing 411 is fixedly connected to the first middle frame 1. A first accommodating cavity is provided in the first housing 411. The first elastic member 412 is disposed in the first accommodating cavity and fixedly connected to the first housing 411. A deformation direction of the first elastic member 412 is along the first direction. The first sliding block 413 is disposed in the first accommodating cavity and fixedly connected to the first elastic member 412.

The second deadlocking component 42 includes a second housing 421, a second elastic member 422, and a second sliding block 423. The second housing 421 is fixedly connected to the second middle frame 2. A second accommodating cavity is provided in the second housing 421. The second elastic member 422 is disposed in the second accommodating cavity and fixedly connected to the second housing 421. A deformation direction of the second elastic member 422 is along the second direction. The second sliding block 423 is disposed in the second receiving cavity and fixedly connected to the second elastic member 422.

It can be understood that when the folding display device receives the first force, the first sliding block 413 slides in the first accommodating cavity along the first direction X under action of the first force, so that the first sliding block 413 moves to the second sliding block. The second elastic member 422 is compressed in an initial state, so that the second sliding block 423 moves along the second direction y under action of an elastic force. As such, the first sliding block 413 and the second sliding block 423 cooperate with each other.

When the folding display device receives the second force, the second sliding block 423 slides along a direction opposite to the second direction y under inertial action and the second elastic member 422 is compressed. The first sliding block 413 slides in a direction opposite to the first direction x under pulling force of the first elastic member 412 and the first sliding block 413 slides back into the first accommodating cavity. As such, the first sliding block 413 and the second sliding block 423 are disengaged, and the first locking component and the second locking component are unlocked, so that the first middle frame 1 and the second middle frame 2 are released from the fixed connection state to realize the free folding of the folding display device.

Specifically, the first housing 411 and the first middle frame 1 can be fixedly connected by adhesive or a mechanical connection, and the second housing 421 and the second middle frame 2 can be fixedly connected by adhesive or a mechanical connection.

Optionally, the first middle frame 1 is provided with a first connection groove, and the second middle frame 2 is provided with a second connection groove. The first housing 411 is cooperatively connected to the first connection groove, and the second housing 421 is cooperatively connected to the second connection groove. Certainly, other fixed connection methods can also be selected and are not limited in the embodiment of the present disclosure.

Specifically, an end of the first sliding block 413 away from the first elastic member 412 is provided with a limiting hole 4131. When the folding display device receives the first force, the first sliding block 413 and the limiting hole 4131 cooperate. When the folding display device receives the second force, the second sliding block 423 slides out from the limiting hole 4131.

Specifically, a size of the limiting hole 4131 is larger than a size of the first sliding block 413. When the second sliding block 423 and the limiting hole 4131 cooperate, a gap exists between the second sliding block 423 and the limiting hole 4131.

Optionally, a cross-sectional shape of the first sliding block 413 is square, a cross-sectional shape of the second sliding block 423 is square, and a cross-sectional shape of the limiting hole 4131 is square. Certainly, the cross-sectional shapes of the sliding block 413, the second sliding block 423, and the limiting hole 4131 can also be other shapes such as circles and are not limited in the embodiment of the present disclosure.

Figure 4:
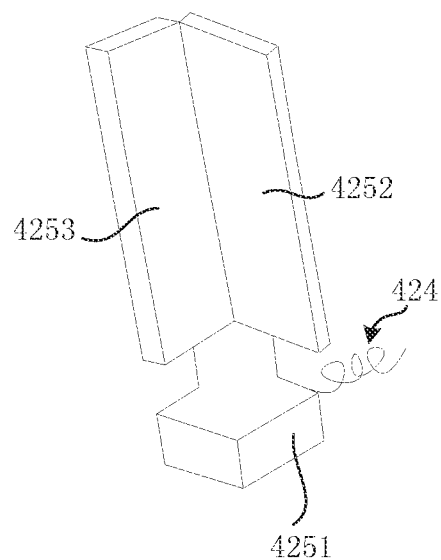
FIG. 4 illustrates a schematic diagram of a connection structure of a stopper and a third elastic member provided by an embodiment of the present disclosure.

Further, please refer to FIG. 3 and FIG. 4. FIG. 4 illustrates a schematic diagram of a connection structure of a stopper and a third elastic member provided by an embodiment of the present disclosure. The second deadlocking component 42 further includes a third elastic member 424 and a stopper 425. The third elastic member 424 is disposed at one side of the second housing 421 away from the first housing 411 and fixedly connected to the second housing 421. A deformation direction of the third elastic member 424 is along the first direction x. The stopper 425 is disposed in the second housing 421 and fixedly connected to the third elastic member 424.

When the folding display device receives the first force, the first sliding block 413 pushes the stopper 425 to slide out from the second housing 421, and the third elastic member 424 is stretched. The stopper 425 loses its blocking and limiting effect on the second sliding block 423, so that the second sliding block 423 moves in the second direction y, and the second sliding block 423 slides to the limiting hole 4131. As such, the first sliding block 413 and the second sliding block 423 cooperate with each other.

When the folding display device receives the second force, the stopper 425 slides in the direction opposite to the first direction x under pulling force of the third elastic member 424, and the stopper 425 slide to one side of the second sliding block 423 to generate the blocking and limiting effect on the second sliding block 423. As such, the first sliding block 413 and the second sliding block 423 are disengaged.

Optionally, the stopper 425 includes a bottom plate 4251, a first limiting plate 4252, and a second limiting plate 4253. The bottom plate 4251 is fixedly connected to the third elastic member 424. The first limiting plate 4252 is configured to limit the first sliding block 413 to slide along the first direction x, and the second limiting plate 4253 is configured to limit the second sliding block 423 to slide along the second direction y.

Specifically, the first limiting plate 4252 and the second limiting plate 4253 both extend in a third direction. The first limiting plate 4252 is located at one side of the first sliding block 413, and the second limiting plate 4253 is located at one side of the second sliding block 423. A length of the first limiting plate 4252 is along the second direction y, and a length of the second limiting plate 4253 is along the first direction x.

Optionally, cross-sectional shapes of the first limiting plate 4252 and the second limiting plate 4253 are rectangular.

Optionally, each of the first elastic member 412, the second elastic member 422, and the third elastic member 424 includes a spring.

Figure 5A:
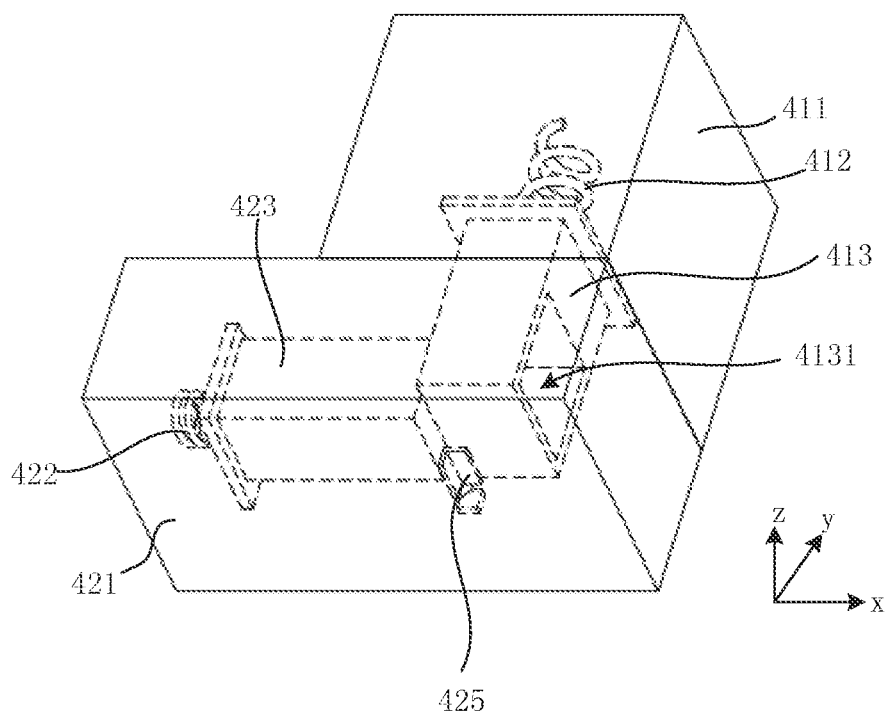
FIG. 5A to FIG. 5C illustrate diagrams of a basic movement principle of the first deadlocking structure provided by an embodiment of the present disclosure.
Figure 5B:
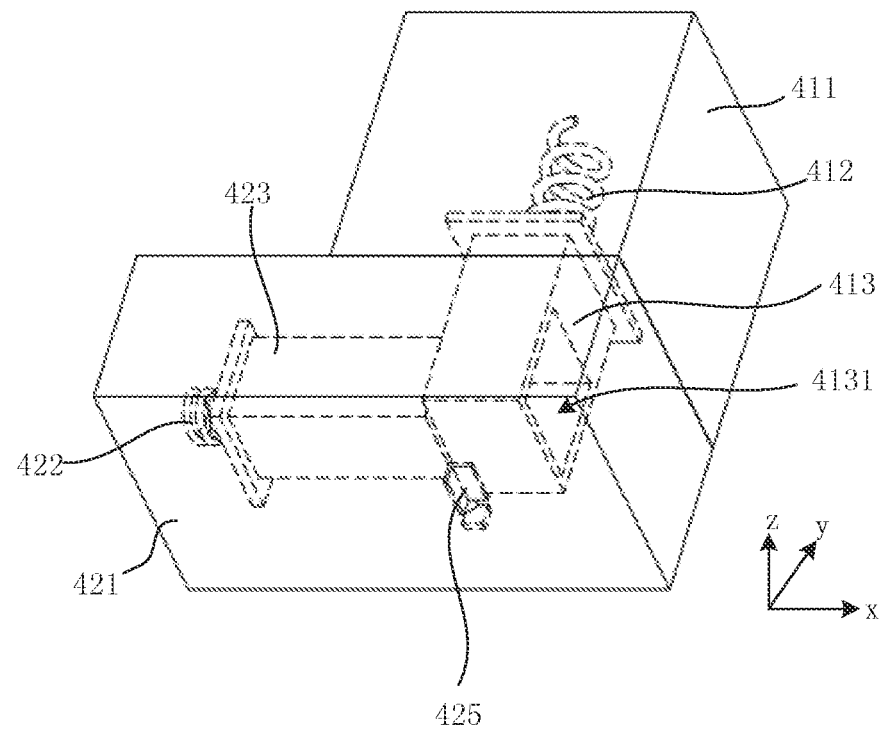
Figure 5C:
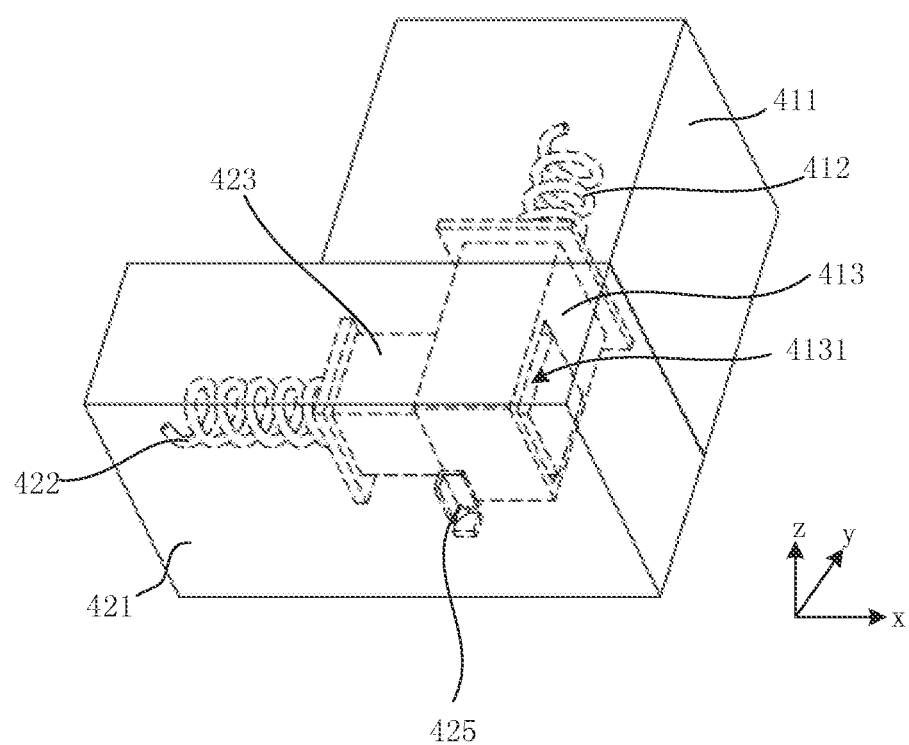

Please refer to FIG. 5A to FIG. 5C. FIG. 5A to FIG. 5C illustrate diagrams of a basic movement principle of the first deadlocking structure provided by an embodiment of the present disclosure. Now, the basic movement principle of the first deadlocking structure 4 is further explained as follows.

As shown in FIG. 5A, when the folding display device is not folded, the first middle frame 1 and the second middle frame 2 are located on the same plane, and the first deadlocking component 41 and the second deadlocking component 42 are not connected. The first elastic member 412 is in a stretched state, the second elastic member 422 is in a compressed state, the third elastic member 424 is in a stretched state. The stopper 425 blocks the second sliding block 423 to slide out, and the first sliding block 413 and the second sliding block 423 do not cooperate.

As shown in FIG. 5B, the folding display device receives the first force along the first direction x. The first sliding block 413 slides along the first direction x under the inertial action. The first elastic member 412 is further stretched, and the first sliding block 413 slides to the stopper 425. When the first force is large enough, the first sliding block 413 can push the stopper 425 to slide along the first direction x. The third elastic member 424 is further stretched, and the stopper 425 loses its blocking and limiting effect on the second sliding block 423, so that the second sliding block 423 slides along the second direction y. The second sliding block 423 extends into and cooperates with the limiting hole 4131, and the first sliding block 413 and the second sliding block 423 cooperate. Since the first sliding block 413 and the second housing 421 can limit displacements along the first direction x and z direction, the first sliding block 413 and the second sliding block 423 can realize displacements along the second direction y and the direction z. As such, displacements along the third directions x, y, and z can be limited. The direction z is perpendicular to a plane where the first direction x and the second direction y are located.

As shown in FIG. 5C, when the folding display device receives the second force along the second direction y, the stopper 425 slides along the direction opposite to the first direction x under the pulling force of the third elastic member 424, and the stopper 425 slide to one side of the second sliding block 423 to generate the blocking and limiting effect on the second sliding block 423. As such, the first sliding block 413 and the second sliding block 423 are disengaged. Finally, the limiting effect along the three directions x, y, and z and z is released, thereby realizing the free folding of the folding display device.

Further, please continue to refer to FIG. 2. When the folding display device falls, a direction of the impact force received by the folding display device is uncertain, for example, along the direction opposite to the first direction x (i.e., the third direction). Accordingly, in order to avoid impact forces in the various directions acting on the bending member 3, the folding display device further includes a second deadlocking structure 5 in the embodiment of the present disclosure. The second deadlocking structure 5 includes a third deadlocking component 51 and a fourth deadlocking component 52. The fourth deadlocking component 52 is fixedly connected to the first middle frame 1, and the third deadlocking component 51 is fixedly connected to the second middle frame 2.

When the folding display device receives a third force along the third direction, the first deadlocking component 41 and the fourth deadlocking component 52 are locked and connected. When the folding display device receives a fourth force along a fourth direction, the third deadlocking component 51 and the fourth deadlocking component 52 are unlocked. The third direction is a direction opposite to the first direction x, and the fourth direction is a direction opposite to the second direction y.

It should be noted that specific structures of the second deadlocking structure 5 and the first deadlocking structure 4 are the same. Specifically, structures of the third deadlocking component 51 and the first deadlocking component 41 are the same, and structures of the fourth deadlocking component 52 and the second deadlocking component 42 are the same.

In the embodiment of the present disclosure, the folding display device includes one first deadlocking structure 4 and one second deadlocking structure 5. However, it should be noted that in other embodiments, in order to realize the fixed connection of the first middle frame 1 and the second middle frame 2 more firmly, the folding display device can further include a plurality of first deadlocking structures 4 and a plurality of second deadlocking structures 5.

An embodiment of the present disclosure further provides an electronic device, which includes the folding display device in any one of the above-mentioned embodiments.

The advantageous effects are described as follows. The folding display device and electronic device provided by the embodiments of the present disclosure are provided with the first deadlocking structure at one side of the bending member. The first deadlocking structure includes the first deadlocking component and the second deadlocking component. The first deadlocking component is fixedly connected to the first middle frame, and the second deadlocking component is fixedly connected to the second middle frame. When the folding display device receives the first force along the first direction (when the folding display device falls), the first deadlocking component and the second deadlocking component are locked and connected to avoid the impact force acting on the bending member. This is beneficial for reducing the probability of defects in the bending members. When the folding display device receives the second force in the second direction (when the folding display device is folded), the first deadlocking component and the second deadlocking component are unlocked, so that the first middle frame 1 and the second middle frame are released from the fixed connection, thereby realizing free folding of the folding display device.

In summary, while the present disclosure is described in connection with preferred embodiments, the preferred embodiments are not intended to limit the present disclosure. Those skilled in the art can make various changes and modifications without departing from the spirit and scope of the present disclosure. Accordingly, the protection scope of the present disclosure is based on the scope defined by the claims.

What is claimed is:

1. A folding display device, comprising:
a first middle frame;
a second middle frame;
two bending members, wherein the first middle frame and the second middle frame are rotatably connected by the bending members, each of the bending members comprises a rotating shaft and two supporting plates, the rotating shaft is fixedly connected to the two supporting plates, and the two supporting plates are fixedly connected to the first middle frame and the second middle frame respectively at one side away from the rotating shaft;
a flexible display panel laid at one side of each of the first middle frame, the second middle frame, and the bending members; and
a first deadlocking structure disposed at one side of one of the bending members, wherein the first deadlocking structure comprises a first deadlocking component and a second deadlocking component, the first deadlocking component is fixedly connected to the first middle frame, and the second deadlocking component is fixedly connected to the second middle frame;
wherein when the folding display device receives a first force in a first direction, the first deadlocking component and the second deadlocking component are locked and connected; when the folding display device receives a second force in a second direction, the first deadlocking component and the second deadlocking component are unlocked; and the first direction and the second direction are perpendicular with each other; and
wherein the first deadlocking component comprises:
a first housing fixedly connected to the first middle frame, wherein a first accommodating cavity is provided in the first housing;
a first elastic member disposed in the first accommodating cavity and fixedly connected to the first housing, wherein a deformation direction of the first elastic member is along the first direction; and
a first sliding block disposed in the first accommodating cavity and fixedly connected to the first elastic member.

2. The folding display device of claim 1, wherein
the second deadlocking component comprises:
a second housing fixedly connected to the second middle frame, wherein a second accommodating cavity is provided in the second housing;
a second elastic member disposed in the second accommodating cavity and fixedly connected to the second housing, wherein a deformation direction of the second elastic member is along the second direction; and
a second sliding block disposed in the second receiving cavity and fixedly connected to the second elastic member; and
wherein when the folding display device receives the first force, the first sliding block and the second sliding block cooperate with each other.

3. The folding display device of claim 2, wherein an end of the first sliding block away from the first elastic member is provided with a limiting hole; when the folding display device receives the first force, the first sliding block and the limiting hole cooperate; and when the folding display device receives the second force, the second sliding block slides out from the limiting hole.

4. The folding display device of claim 3, wherein the second deadlocking component further comprises:
a third elastic member disposed at one side of the second housing away from the first housing and fixedly connected to the second housing, wherein a deformation direction of the third elastic member is along the first direction; and
a stopper disposed in the second housing and fixedly connected to the third elastic member; and
wherein when the folding display device receives the first force, the first sliding block pushes the stopper to slide out from the second housing; and when the folding display device receives the second force, the second sliding block blocks the first sliding block to slide.

5. The folding display device of claim 4, wherein the stopper comprises:
a bottom plate fixedly connected to the third elastic member;
a first limiting plate and a second limiting plate which are connected to the bottom plate, wherein the first limiting plate is configured to limit the first sliding block to slide along the first direction, and the second limiting plate is configured to limit the second sliding block to slide along the second direction.

6. The folding display device of claim 5, wherein shapes of the first limiting plate and the second limiting plate are rectangular.

7. The folding display device of claim 2, wherein the first middle frame is provided with a first connection groove, the second middle frame is provided with a second connection groove, the first housing is cooperatively connected to the first connection groove, and the second housing is cooperatively connected to the second connection groove.

8. The folding display device of claim 2, wherein cross-sectional shapes of the first sliding block and the second sliding block are square.

9. The folding display device of claim 2, wherein each of the first elastic member and the second elastic member comprises a spring.

10. The folding display device of claim 1, wherein the folding display device further comprises a second deadlocking structure, the second deadlocking structure comprises a third deadlocking component and a fourth deadlocking component, the fourth deadlocking component is fixedly connected to the first middle frame, and the third deadlocking component is fixedly connected to the second middle frame; and
when the folding display device receives a third force along a third direction, the first deadlocking component and the fourth deadlocking component are locked and connected; when the folding display device receives a fourth force along a fourth direction, the third deadlocking component and the fourth deadlocking component are unlocked; and the third direction is a direction opposite to the first direction, and the fourth direction is a direction opposite to the second direction.

11. A folding display device, comprising:
a first middle frame;
a second middle frame;

two bending members, wherein the first middle frame and the second middle frame are rotatably connected by the bending members;
a flexible display panel laid at one side of each of the first middle frame, the second middle frame, and the bending members; and
a first deadlocking structure disposed at one side of one of the bending members, wherein the first deadlocking structure comprises a first deadlocking component and a second deadlocking component, the first deadlocking component is fixedly connected to the first middle frame, and the second deadlocking component is fixedly connected to the second middle frame;
wherein when the folding display device receives a first force in a first direction, the first deadlocking component and the second deadlocking component are locked and connected; when the folding display device receives a second force in a second direction, the first deadlocking component and the second deadlocking component are unlocked; and the first direction and the second direction are different; and
wherein the first deadlocking component comprises:
a first housing fixedly connected to the first middle frame, wherein a first accommodating cavity is provided in the first housing;
a first elastic member disposed in the first accommodating cavity and fixedly connected to the first housing, wherein a deformation direction of the first elastic member is along the first direction; and
a first sliding block disposed in the first accommodating cavity and fixedly connected to the first elastic member.

12. The folding display device of claim 11, wherein the second deadlocking component comprises:
a second housing fixedly connected to the second middle frame, wherein a second accommodating cavity is provided in the second housing;
a second elastic member disposed in the second accommodating cavity and fixedly connected to the second housing, wherein a deformation direction of the second elastic member is along the second direction; and
a second sliding block disposed in the second receiving cavity and fixedly connected to the second elastic member; and
wherein when the folding display device receives the first force, the first sliding block and the second sliding block cooperate with each other.

13. The folding display device of claim 12, wherein an end of the first sliding block away from the first elastic member is provided with a limiting hole; when the folding display device receives the first force, the first sliding block and the limiting hole cooperate; and when the folding display device receives the second force, the second sliding block slides out from the limiting hole.

14. The folding display device of claim 13, wherein the second deadlocking component further comprises:
a third elastic member disposed at one side of the second housing away from the first housing and fixedly connected to the second housing, wherein a deformation direction of the third elastic member is along the first direction; and
a stopper disposed in the second housing and fixedly connected to the third elastic member; and
wherein when the folding display device receives the first force, the first sliding block pushes the stopper to slide out from the second housing; and when the folding display device receives the second force, the second sliding block blocks the first sliding block to slide.

15. The folding display device of claim 14, wherein the stopper comprises:
a bottom plate fixedly connected to the third elastic member;
a first limiting plate and a second limiting plate which are connected to the bottom plate, wherein the first limiting plate is configured to limit the first sliding block to slide along the first direction, and the second limiting plate is configured to limit the second sliding block to slide along the second direction.

16. The folding display device of claim 12, wherein the first middle frame is provided with a first connection groove, the second middle frame is provided with a second connection groove, the first housing is cooperatively connected to the first connection groove, and the second housing is cooperatively connected to the second connection groove.

17. The folding display device of claim 11, wherein each of the bending members comprises a rotating shaft and two supporting plates, the rotating shaft is fixedly connected to the two supporting plates, and the two supporting plates are fixedly connected to the first middle frame and the second middle frame respectively at one side away from the rotating shaft.

18. The folding display device of claim 11, wherein the folding display device further comprises a second deadlocking structure, the second deadlocking structure comprises a third deadlocking component and a fourth deadlocking component, the fourth deadlocking component is fixedly connected to the first middle frame, and the third deadlocking component is fixedly connected to the second middle frame; and
when the folding display device receives a third force along a third direction, the first deadlocking component and the fourth deadlocking component are locked and connected; when the folding display device receives a fourth force along a fourth direction, the third deadlocking component and the fourth deadlocking component are unlocked; and the third direction is a direction opposite to the first direction, and the fourth direction is a direction opposite to the second direction.

19. The folding display device of claim 11, wherein the first direction and the second direction are perpendicular with each other.

20. An electronic device, comprising a folding display device, the folding display device comprising:
a first middle frame;
a second middle frame;
two bending members, wherein the first middle frame and the second middle frame are rotatably connected by the bending members;
a flexible display panel laid at one side of each of the first middle frame, the second middle frame, and the bending members; and
a first deadlocking structure disposed at one side of one of the bending members, wherein the first deadlocking structure comprises a first deadlocking component and a second deadlocking component, the first deadlocking component is fixedly connected to the first middle frame, and the second deadlocking component is fixedly connected to the second middle frame;
wherein when the folding display device receives a first force in a first direction, the first deadlocking component and the second deadlocking component are locked and connected; when the folding display device receives a second force in a second direction, the first deadlocking component and the second deadlocking component are unlocked; and the first direction and the second direction are different; and wherein the first deadlocking component comprises:

a first housing fixedly connected to the first middle frame, wherein a first accommodating cavity is provided in the first housing;

a first elastic member disposed in the first accommodating cavity and fixedly connected to the first housing, wherein a deformation direction of the first elastic member is along the first direction; and a first sliding block disposed in the first accommodating cavity and fixedly connected to the first elastic member.

* * * * *